United States Patent
Chen et al.

(10) Patent No.: US 8,957,872 B2
(45) Date of Patent: Feb. 17, 2015

(54) TOUCH SENSING CIRCUIT AND TOUCH SENSING METHOD

(71) Applicant: Princeton Technology Corporation, New Taipei (TW)

(72) Inventors: Chun-Hsiung Chen, New Taipei (TW); Chieh Yung Tu, New Taipei (TW); Chien-Hsien Tsai, New Taipei (TW); Chia Sheng Chen, New Taipei (TW)

(73) Assignee: Princeton Technology Corporation, New Taipei (TW)

( * ) Notice: Subject to any disclaimer, the term of this patent is extended or adjusted under 35 U.S.C. 154(b) by 204 days.

(21) Appl. No.: 13/836,402

(22) Filed: Mar. 15, 2013

(65) Prior Publication Data

US 2014/0132336 A1 May 15, 2014

(30) Foreign Application Priority Data

Nov. 15, 2012 (TW) .............................. 101142559 A

(51) Int. Cl.
*G06F 3/044* (2006.01)
*H03K 17/96* (2006.01)

(52) U.S. Cl.
CPC ................................. *H03K 17/9622* (2013.01)

USPC ........................................................... 345/173

(58) Field of Classification Search
USPC ........................................................... 345/173
See application file for complete search history.

(56) References Cited

U.S. PATENT DOCUMENTS

2011/0157072 A1* 6/2011 Chang ............................ 345/174

* cited by examiner

*Primary Examiner* — Adam R Giesy
(74) *Attorney, Agent, or Firm* — Muncy, Geissler, Olds & Lowe, P.C.

(57) ABSTRACT

The present invention discloses a touch-sensing method, applied to a touch-sensing circuit, wherein the touch-sensing circuit includes a detection circuit and a comparison circuit. The touch-sensing method includes: enabling a receiving node to be coupled to a ground during a first discharge period, wherein the receiving node is coupled between the detection circuit and the comparison circuit; enabling the receiving node to obtain a first reference voltage during a first charge period; enabling the receiving node to be coupled to the ground during a second discharge period; and enabling the receiving node to obtain a second reference voltage and producing a sensing result according to the first reference voltage and the second reference voltage by the comparison circuit during a second charge period, wherein the sensing result represents whether a touch event occurs at a first node of the touch-sensing circuit.

18 Claims, 7 Drawing Sheets

TOUCH SENSING CIRCUIT AND TOUCH SENSING METHOD

CROSS REFERENCE TO RELATED APPLICATIONS

This Application claims priority of Taiwan Patent Application No. 101142559, filed on Nov. 15, 2012, the entirety of which is incorporated by reference herein.

BACKGROUND OF THE INVENTION

1. Field of the Invention

The present invention relates to a touch-sensing circuit, and in particular to a touch-sensing circuit arranged to detect a touch event according to the reference voltages corresponding to different periods.

2. Description of the Related Art

Presently, mobile devices are highly developed and multifunctional. For example, handheld devices such as mobile phones or tablets are capable of conducting telecommunications, receiving and transmitting e-mails, maintaining social networks, managing contacts, and playing media. Hence, users can implement various applications on their mobile devices, such as a simple phone call, social network interaction, or commercial transaction. Therefore, mobile devices have become one of the necessities of people's lives.

Most of the current handheld devices include touch screens and touch units. Users may input information and commands using it. FIG. 1 is a common touch-sensing circuit 100. The common touch-sensing circuit 100 includes a resistor R0, a capacitor C0, a comparator COM0 and a switch SW0. The resistor R0 has a first terminal coupled to a voltage source VDD, and a second terminal connected to a first input terminal of the comparator COM0. The capacitor C0 has a first terminal connected to the first input terminal of the comparator COM0, and a second terminal connected to a ground GND. The comparator COM0 is arranged to determine whether the capacitor C0 is fully charged by the voltage source VDD according to a reference voltage Vref provided by a second input terminal and a signal received by the first input terminal. When the capacitor C0 is fully charged, the comparator COM0 is arranged to enable the switch SW0 to be connected to the ground GND to discharge the capacitor C0.

When no touch event occurs, the capacitor C0 needs a first period to be fully charged. When a touch event occurs, the capacitance of the capacitor C0 is increased, and the capacitor C0 needs a second period which is longer than the first period to be fully charged. Therefore, the touch-sensing circuit 100 can determine whether a touch event occurs according to the time that the capacitor C0 needs to be fully charged. However, the sensing circuit 100 needs a resistor R0 with large resistance to avoid noise. Furthermore, the sensing circuit 100 needs to detect whether the capacitor C0 is fully charged with a high frequency. Therefore, the sensing circuit 100 requires a lot of power.

BRIEF SUMMARY OF THE INVENTION

A detailed description is given in the following embodiments with reference to the accompanying drawings.

The touch-sensing circuit and the touch-sensing method provided by the present invention include a detection circuit having a plurality of capacitors. Therefore, the touch-sensing circuit and the touch-sensing method of the present invention can inhibit the power interference of the traditional touch panel. Furthermore, the touch-sensing circuit and the touch-sensing method of the present invention do not need to read the number of times the capacitor discharges with high frequency, such that the system power requirement is decreased.

The present invention discloses a touch-sensing circuit. The touch-sensing circuit includes a detection circuit, a fourth capacitor, and a comparison circuit. The fourth capacitor has a first terminal coupled to a voltage source, and a second terminal coupled to the receiving node. The comparison circuit is arranged to produce a sensing result according to a voltage at the receiving node. The detection circuit further includes a first node, a first capacitor, a second capacitor, a third capacitor, a first switch, a second switch, and a third switch. The first node is arranged to generate a sensing capacitor according to a touch event. The first capacitor has a first terminal coupled to the first node, and a second terminal coupled to a ground. The second capacitor has a first terminal coupled to the first node, and a second terminal coupled to a second node. The third capacitor has a first terminal coupled to the second node, and a second terminal coupled to the ground. The first switch is arranged to be coupled between the first node and the ground. The second switch is arranged to be coupled between the second node and the ground. The third switch is arranged to couple the first node or the second node to a receiving node.

Additionally, the present invention further discloses a touch-sensing method, applied to a touch-sensing circuit, wherein the touch-sensing circuit includes a detection circuit and a comparison circuit. The touch-sensing method includes: enabling a receiving node to be coupled to a ground during the first discharge period, wherein the receiving node is coupled between the detection circuit and the comparison circuit; enabling the receiving node to obtain a first reference voltage during a first charge period; enabling the receiving node to be coupled to the ground during a second discharge period; and enabling the receiving node to obtain a second reference voltage and producing a sensing result according to the first reference voltage and the second reference voltage by the comparison circuit during a second charge period, wherein the sensing result represents whether a touch event occurs at a first node of the touch-sensing circuit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
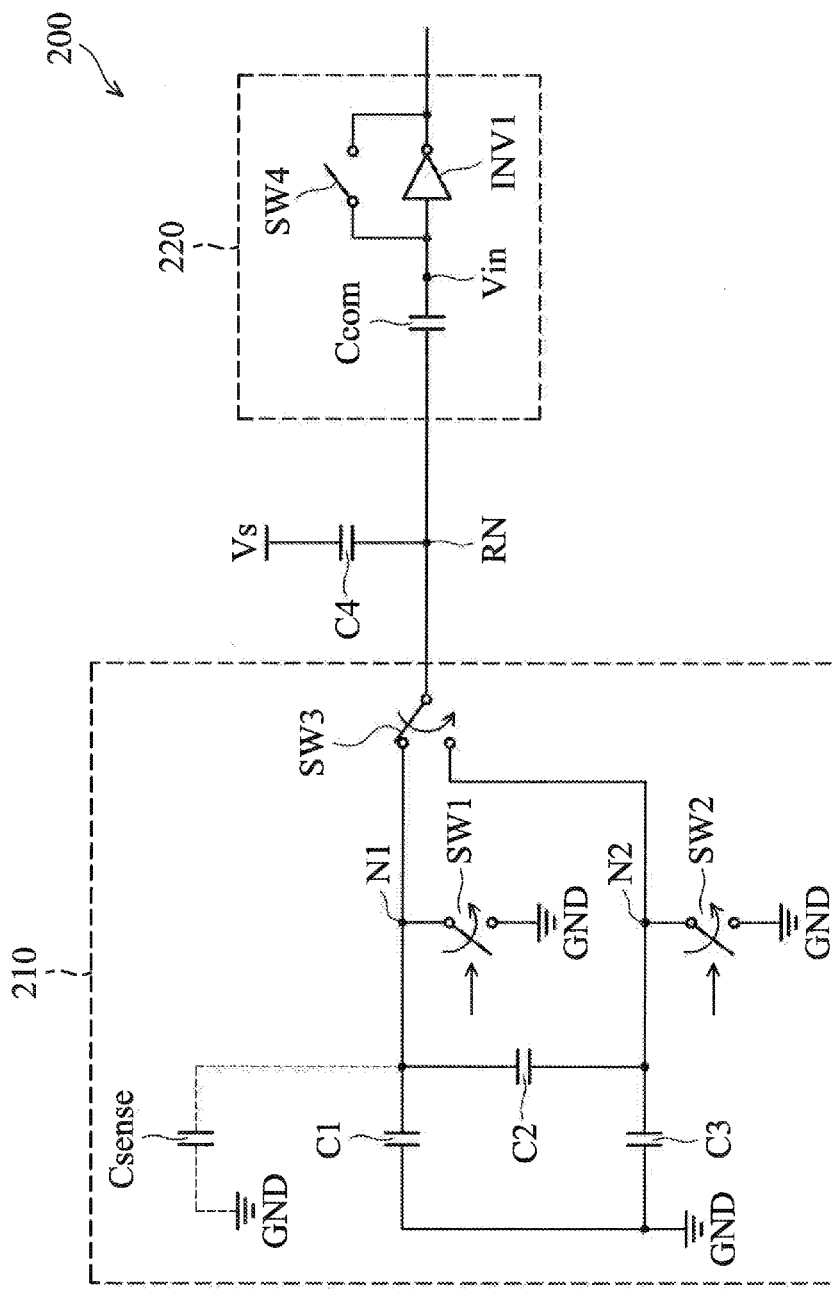
FIG. 2 is a schematic diagram illustrating an embodiment of a touch-sensing circuit of the present invention.

FIG. 2 is a schematic diagram illustrating an embodiment of a touch-sensing circuit of the present invention. The touch-sensing circuit 200 includes a detection circuit 210, a fourth capacitor C4 and a comparison circuit 220. The operation of the touch-sensing circuit 200 has a first discharge period, a first charge period, a second discharge period, and a second charge period, wherein the first charge period is scheduled after the first discharge period, the second discharge period is scheduled after the first charge period, and the second charge period is scheduled after the second discharge period. The detection circuit 210 is coupled to a receiving node RN. Moreover, the detection circuit 210 can be used to form different equivalent circuits by a plurality of switches in different periods, such that the receiving node RN will obtain different reference voltages in different periods. The fourth capacitor C4 has a first terminal coupled to a voltage source Vs, and a second terminal coupled to the receiving node RN. The comparison circuit 220 has a first terminal coupled to the receiving node RN, and a second terminal arranged to output a sensing result according to the reference voltage obtained by the receiving node RN. The touch-sensing circuit 200 can be applied to a computer configuration with a capacitive touch panel, such as a hand-held device, a multi-processor system, a microprocessor-based or programmable consumer electronic product, a mini computer, a tablet PC or the like, but it is not limited thereto. Moreover, the computer configuration with the capacitive touch panel further includes at least one processor and a plurality of signal lines. The processor and signal lines are arranged to receive the sensing results produced by the touch-sensing circuit 200, and control the switches in the touch-sensing circuit 200 and the voltage supply of the touch-sensing circuit 200.

The detection circuit 210 includes a first node N1, a first capacitor C1, a second capacitor C2, a third capacitor C3, a first switch SW1, a second switch SW2 and a third switch SW3. The first node N1 is arranged to generate a sensing capacitor Csense according to a touch event. For example, when the touch event occurs, the first node N1 generates a sensing capacitor Csense, wherein the sensing capacitor Csense has a first terminal coupled to the first node N1, and a second terminal coupled to a ground GND. The first capacitor C1 has a first terminal coupled to the first node N1, and a second terminal coupled to a ground GND. The second capacitor C2 has a first terminal coupled to the first node N1, and a second terminal coupled to a second node N2. The third capacitor C3 has a first terminal coupled to the second node N2, and a second terminal coupled to the ground GND. The first switch SW1 is arranged to be coupled between the first node N1 and the ground GND. The second switch SW2 is arranged to be coupled between the second node N2 and the ground GND. The third switch SW3 is arranged to couple the first node N1 or the second node N2 to the receiving node RN.

The comparison circuit 220 includes a comparing capacitor Ccom, an inverter INV1 and a fourth switch SW4. The comparing capacitor Ccom has a first terminal arranged to be coupled to the receiving node RN, and a second terminal arranged to be coupled to the input terminal of the inverter INV1. The inverter INV1 has an input terminal arranged to be coupled to the second terminal of the comparing capacitor Ccom, and an output terminal arranged to output the sensing result. The fourth switch SW4 is arranged to be coupled between the first terminal and the second terminal of the inverter INV1. It should be noted that the first switch SW1, the second switch SW2, the third switch SW3 and the fourth switch SW4 can be p-type FET transistors and/or n-type FET transistors, but it is not limited thereto. The inverter INV1 can be a CMOS inverter with a threshold voltage VT, but it is not limited thereto. For example, the inverter INV1 can be a PMOS inverter, a NMOS inverter or an inverter formed by PMOS and NMOS, but it is not limited thereto. When the voltage Vin received by the inverter INV1 is smaller than the threshold voltage VT, the inverter INV1 outputs 1. When the voltage Vin received by the inverter INV1 is larger than the threshold voltage VT, the inverter INV1 outputs 0.

Figure 3:
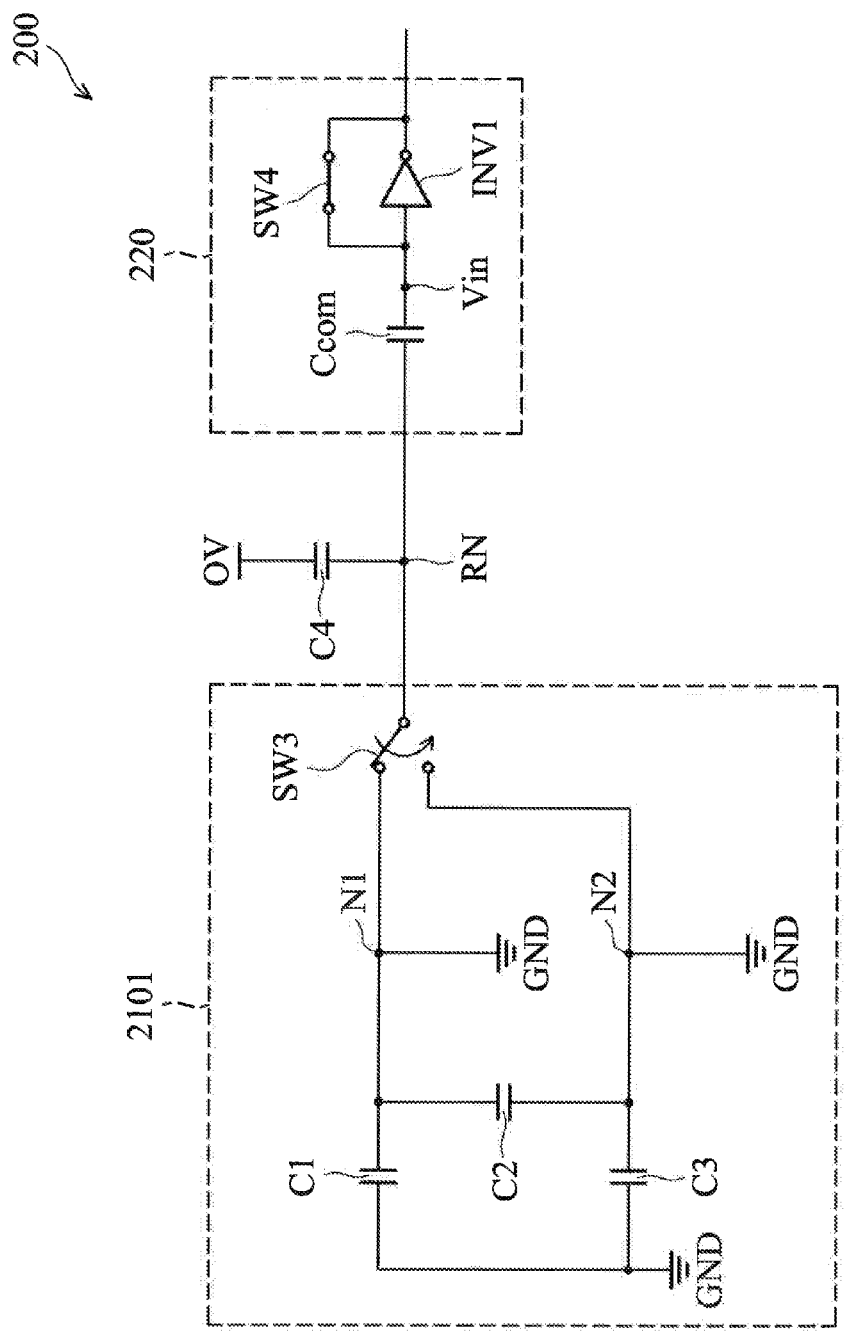
FIG. 3 is a schematic diagram illustrating an embodiment of an equivalent circuit of the touch-sensing circuit of the present invention.

The first switch SW1 is turned on during the first discharge period, such that the first node N1 is coupled to the ground GND. The second switch SW2 is turned on during the first discharge period, such that the second node N2 is coupled to the ground GND. The third switch SW3 is arranged to couple the receiving node RN with the first node N1 during the first discharge period. As shown in FIG. 3, the detection circuit 210 is a first discharge equivalent circuit 2101 during the first discharge period, wherein the receiving node RN is further arranged to be coupled to the ground GND through the first node N1 during the first discharge period. In another embodiment of the present invention, the third switch SW3 can also couple the receiving node RN to the second node N2, and the receiving node RN is further arranged to be coupled to the ground GND through the second node N2 during the first discharge period, but it is not limited thereto. Moreover, during the first discharge period, the voltage source Vs is 0 volts, and the fourth switch SW4 of the comparison circuit 220 is arranged to couple the input terminal of the inverter INV1 to the output terminal of the inverter INV1. It should be noted that, when the input terminal and the output terminal of the inverter INV1 are coupled with each other, the threshold voltage VT serves as the voltage Vin. Moreover, the first capacitor C1, the second capacitor C2, the third capacitor C3, the fourth capacitor C4, and the comparing capacitor Ccom are discharged for resetting the touch-sensing circuit 200 during the first discharge period.

Figure 4:
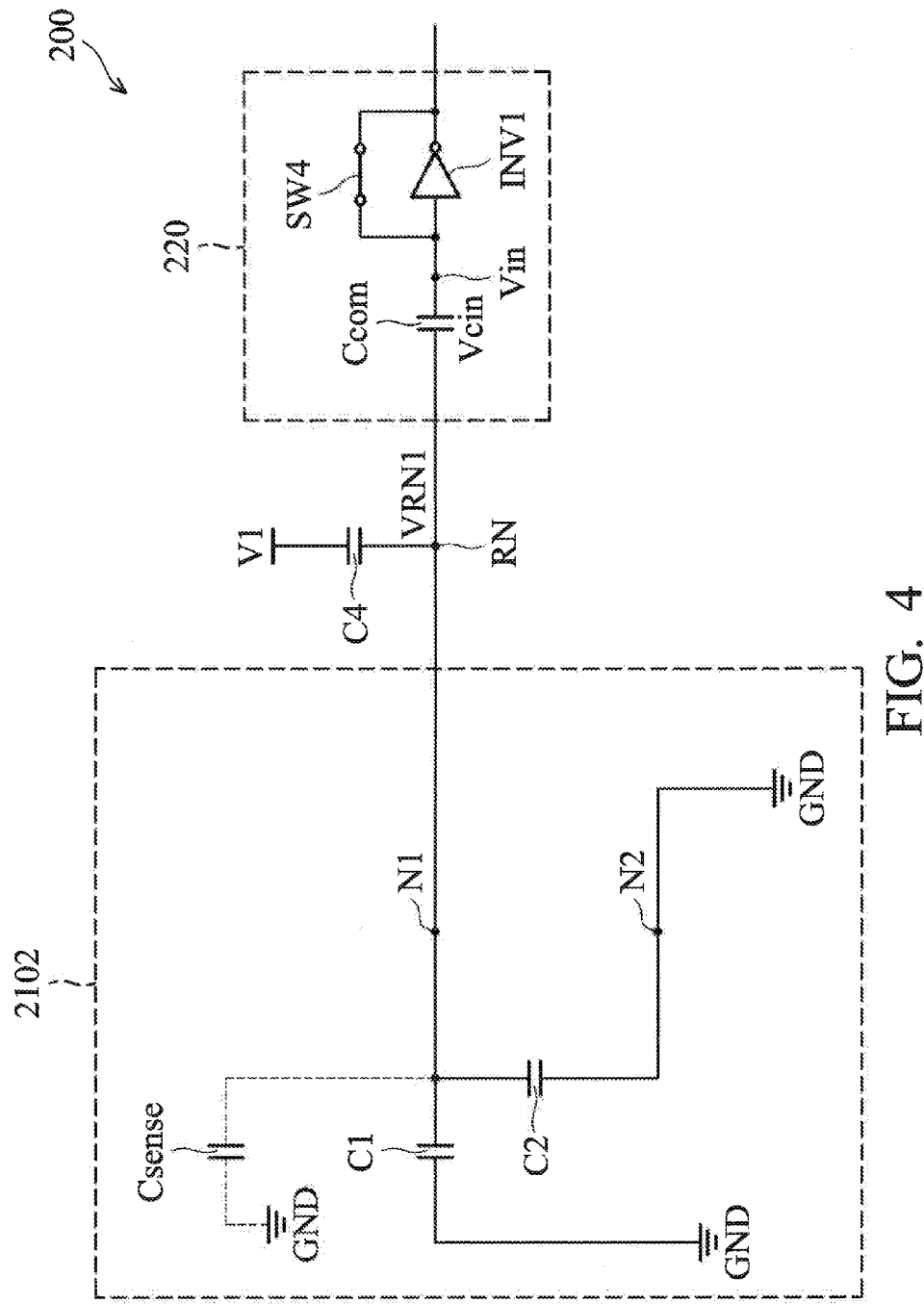
FIG. 4 is a schematic diagram illustrating another embodiment of an equivalent circuit of the touch-sensing circuit of the present invention.

The first switch SW1 is turned off during the first charge period. The second switch SW2 is turned on during the first charge period, such that the second node N2 is coupled to the ground GND. The third switch SW3 is arranged to couple the receiving node RN to the first node N1 during the first charge period. As shown in FIG. 4, the detection circuit 210 is the first charge equivalent circuit 2102 during the first charge period. Moreover, during the first charge period, the voltage source Vs is a predetermined voltage V1, and the fourth switch SW4 of the comparison circuit 220 is arranged to couple the input terminal of the inverter INV1 to the output terminal of the inverter INV1. The receiving node RN obtains a first reference voltage VRN1 in the first charge equivalent circuit 2102. Based on the rationale for operating the capacitive voltage-dividing circuit, we can obtain equation (1).

$$VRN1 = V1 \times \frac{C4}{C1 + C2 + C4 + Ccom + Csense} \qquad \text{equation (1)}$$

Furthermore, when the input terminal and the output terminal of the inverter INV1 are coupled with each other and the receiving node RN obtains the first reference voltage VRN1, the comparing capacitor Ccom is charged to a comparison voltage Vcin according to the first reference voltage VRN1. Based on the threshold voltage VT serving as the voltage Vin when the input terminal and the output terminal of the inverter INV1 are coupled with each other, we can obtain equation(2).

$$Vcin = VRN - VT = V1 \times \frac{C4}{C1 + C2 + C4 + Ccom + Csense} - VT \quad \text{equation (2)}$$

Figure 5:
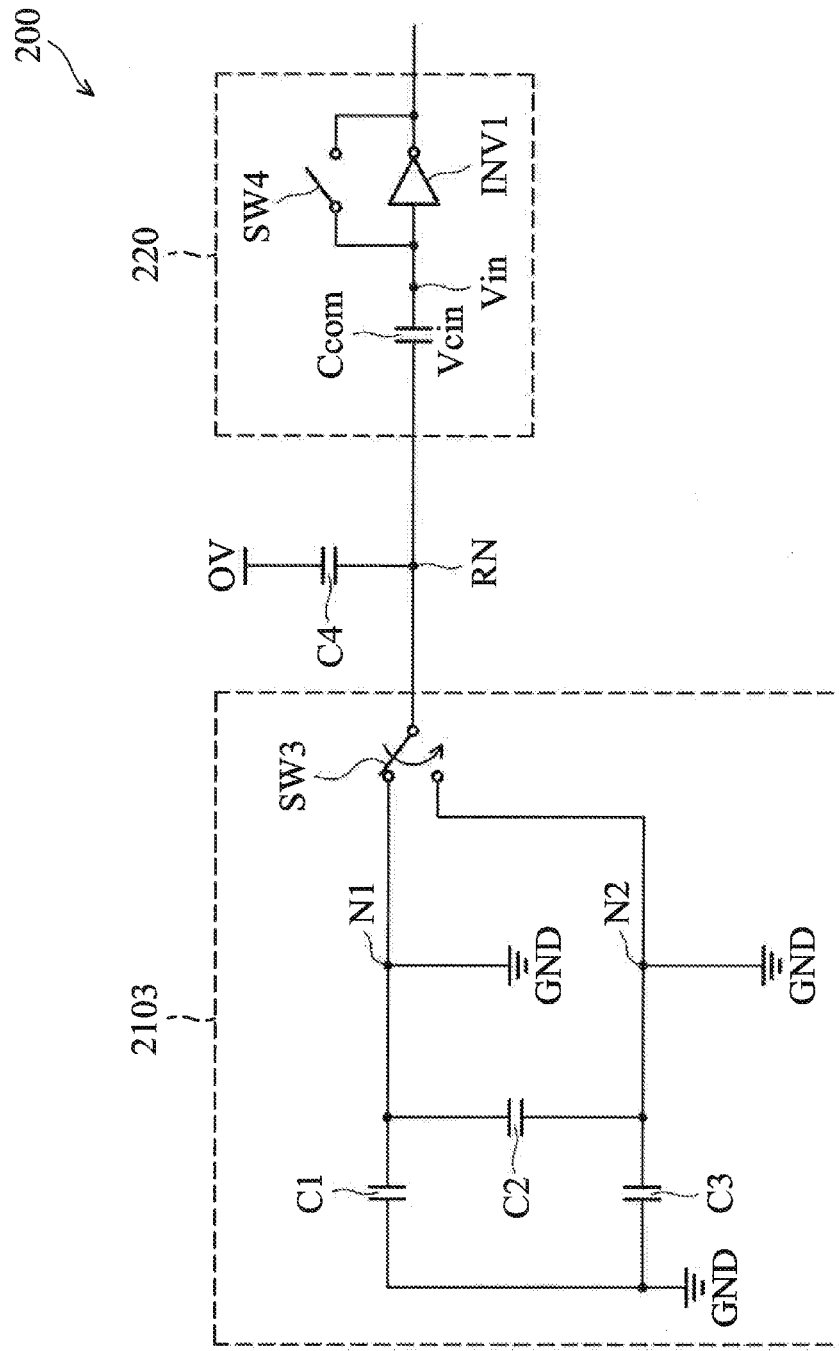
FIG. 5 is a schematic diagram illustrating another embodiment of an equivalent circuit of the touch-sensing circuit of the present invention.

The first switch SW1 is turned on for coupling the first node N1 to the ground GND during the second discharge period. The second switch SW2 is turned on for coupling the second node N2 to the ground GND during the second discharge period. The third switch SW3 is arranged to couple the receiving node RN to the second node N2 during the second discharge period. As shown in FIG. 5, the detection circuit 210 is a second discharge equivalent circuit 2103 during the second discharge period, wherein the receiving node RN is further arranged to be coupled to the ground GND through the second node N2 during the second discharge period. In another embodiment of the present invention, the third switch SW3 is arranged to couple the receiving node RN to the first node N1, and the receiving node RN is arranged to be coupled to the ground GND through the first node N1 during the second discharge period, but it is not limited thereto. Moreover, during the second discharge period, the voltage source Vs is 0 volts and the fourth switch SW4 of the comparison circuit 220 is arranged to decouple the input terminal of the inverter INV1 from the output terminal of the inverter INV1, such that the voltage across the comparing capacitor Ccom keeps at the comparison voltage Vcin. Moreover, the first capacitor C1, the second capacitor C2, the third capacitor C3, and the fourth capacitor C4 are discharged for resetting the detection circuit 210 during the second discharge period.

Figure 6:
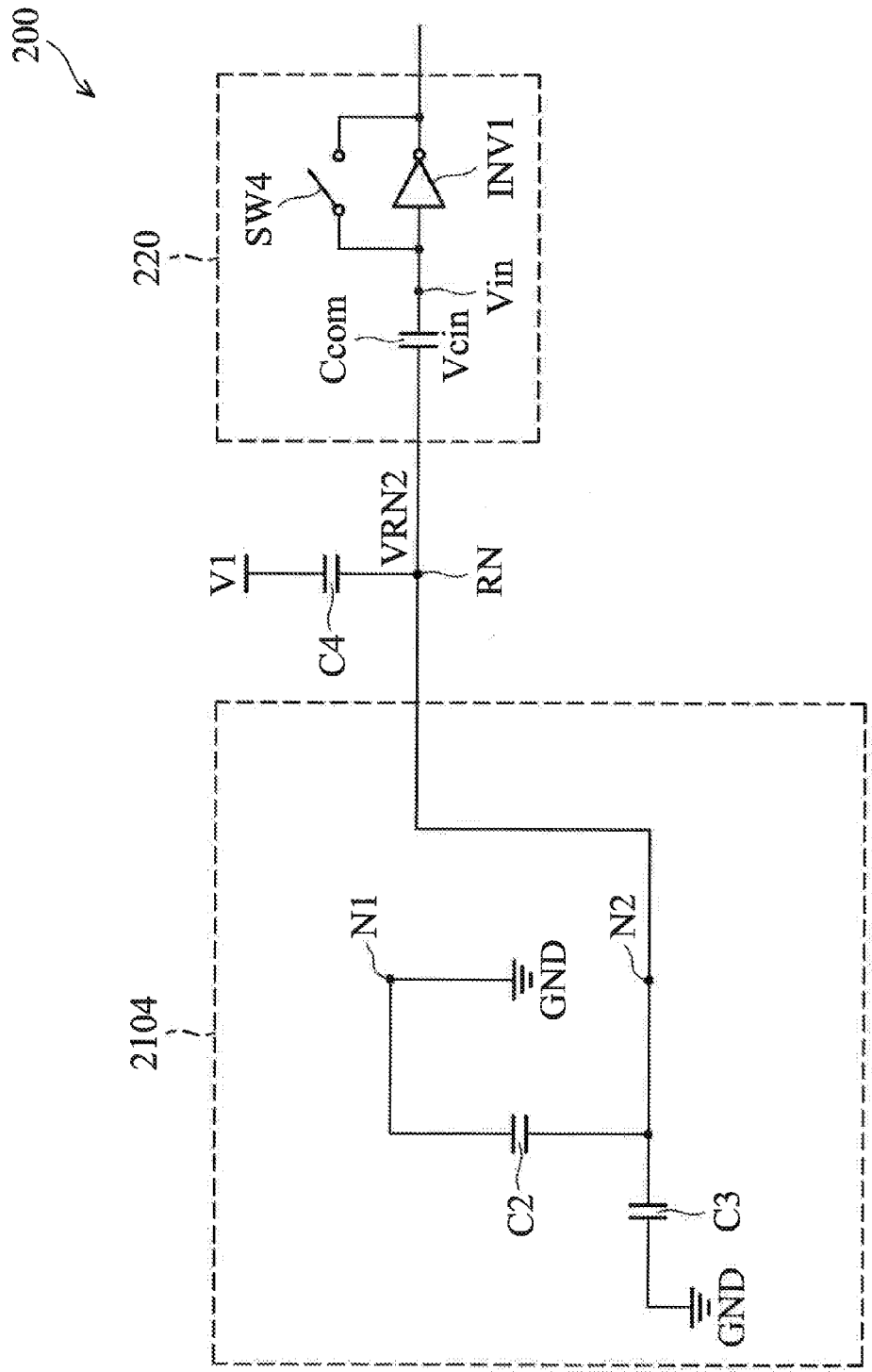
FIG. 6 is a schematic diagram illustrating another embodiment of an equivalent circuit of the touch-sensing circuit of the present invention.

The first switch SW1 is turned on during the second charge period, such that the first node N1 is coupled to the ground GND. The second switch SW2 is turned off during the second charge period. The third switch SW3 is arranged to couple the receiving node RN to the second node N2 during the second charge period. As shown in FIG. 6, the detection circuit 210 is the second charge equivalent circuit 2104 during the second charge period. Moreover, during the second charge period, the voltage source Vs is a predetermined voltage V1 and the fourth switch SW4 of the comparison circuit 220 is arranged to decouple the input terminal of the inverter INV1 from the output terminal of the inverter INV1, such that the inverter INV1 produces the sensing result according to the second reference voltage VRN2 and the comparison voltage Vcin. The receiving node RN obtains a second reference voltage VRN2 in the second charge equivalent circuit 2104. Based on rationale for operating the capacitive voltage-dividing circuit, we can obtain equation (3).

$$VRN2 = V1 \times \frac{C4}{C2 + C3 + C4} \quad \text{equation (3)}$$

Based on the schematic diagram and equation (2), we obtain equation (4).

$$Vin = VRN - Vcin = V1 \times \frac{C4}{C2 + C3 + C4} -$$
$$V1 \times \frac{C4}{C1 + C2 + C4 + Ccom + Csense} + VT \quad \text{equation (4)}$$

We can obtain equation (5) by substituting the CT into the equation (4), $$\text{wherein } CT = (C1 + C2 + C4 + Ccom + Csense) * (C2 + C3 + C4). \quad \text{equation (5)}$$
$$Vin = \frac{V1 \times C4 \times (C1 - C3 + Ccom + Csense)}{CT} + VT$$

It should be noted that, in one of the embodiments of the present invention, the capacitance of the comparing capacitor Ccom is much smaller than the difference between the capacitance of the first capacitor C1 and the capacitance of the third capacitor C3 (Ccom<<(C1−C3)). Therefore, equation (5) can be simplified into equation (6).

$$Vin = \frac{V1 \times C4 \times (C1 - C3 + Csense)}{CT} + VT \quad \text{equation (6)}$$

Based on equation (6), when the touch event does not occur on the first node N1, we can obtain equation (7).

$$Vin = \frac{V1 \times C4 \times (C1 - C3)}{CT} + VT \quad \text{equation (7)}$$

Based on equation (6), when the touch event occurs on the first node N1, we can obtain equation (8).

$$Vin = \frac{V1 \times C4 \times (C1 - C3 + Csense)}{CT} + VT \quad \text{equation (8)}$$

In one of the embodiments of the present invention, the capacitance of the first capacitor C1 is smaller than the third capacitor C3 (C1<C3), and the capacitance of the sensing capacitor Csense is larger than the difference between the capacitance of the third capacitor C3 and the first capacitor C1 (Csense>(C3−C1)). Based on the equation (7) we know that the voltage Vin is smaller than the threshold voltage VT (Vin<VT) when the touch event does not occur on the first node N1. Based on the equation (8) we know that the voltage Vin is larger than the threshold voltage VT (Vin>VT) when the touch event occurs on the first node N1. Therefore, when the touch event does not occur on the first node N1, the voltage Vin is smaller than the threshold voltage VT, and the sensing result of the inverter INV1 is 1. When the touch event occurs on the first node N1, the voltage Vin is larger than the threshold voltage VT, and the sensing result outputted by the inverter INV1 is 0. The touch-sensing circuit 200 determines whether a touch event occurs according to the sensing result outputted by the inverter INV1 during the second charge period. It should be noted that the first discharge period, the first charge period, the second discharge period and the second charge period constitute a complete determining period. The touch-sensing circuit 200 can repeat the determining period to detect whether a touch event occurs on the first node N1. For example, the determining period can be executed 10-20 times or 50-100 times in one second, but it is not limited thereto.

Figure 1:
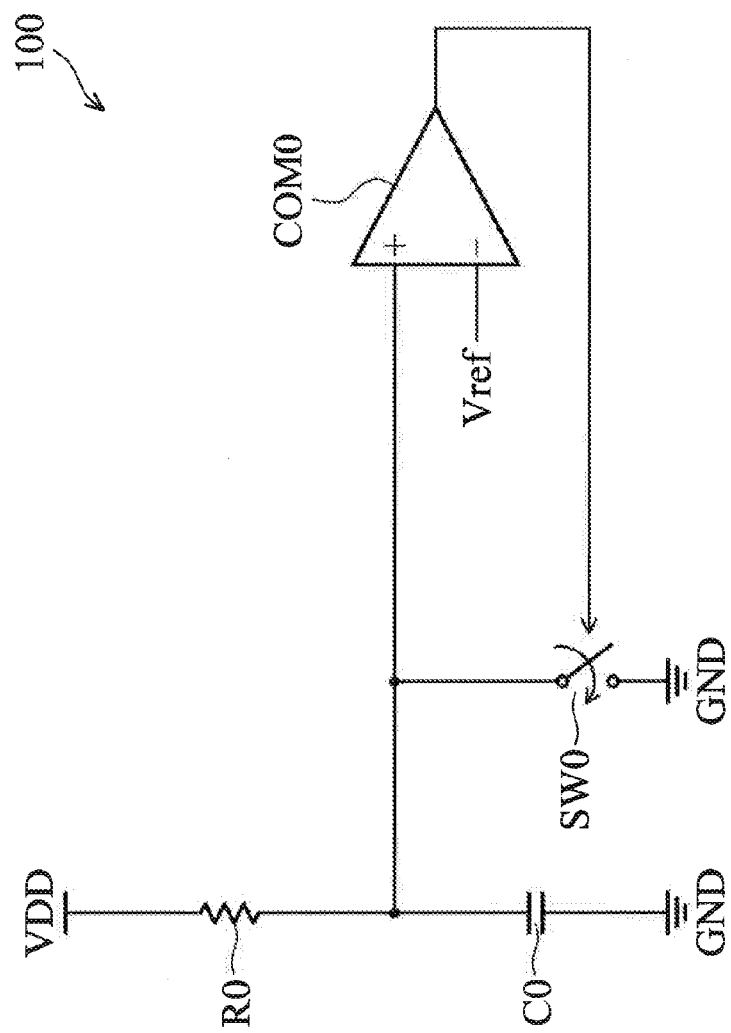
FIG. 1 is a schematic diagram illustrating a conventional touch-sensing circuit.
Figure 7:
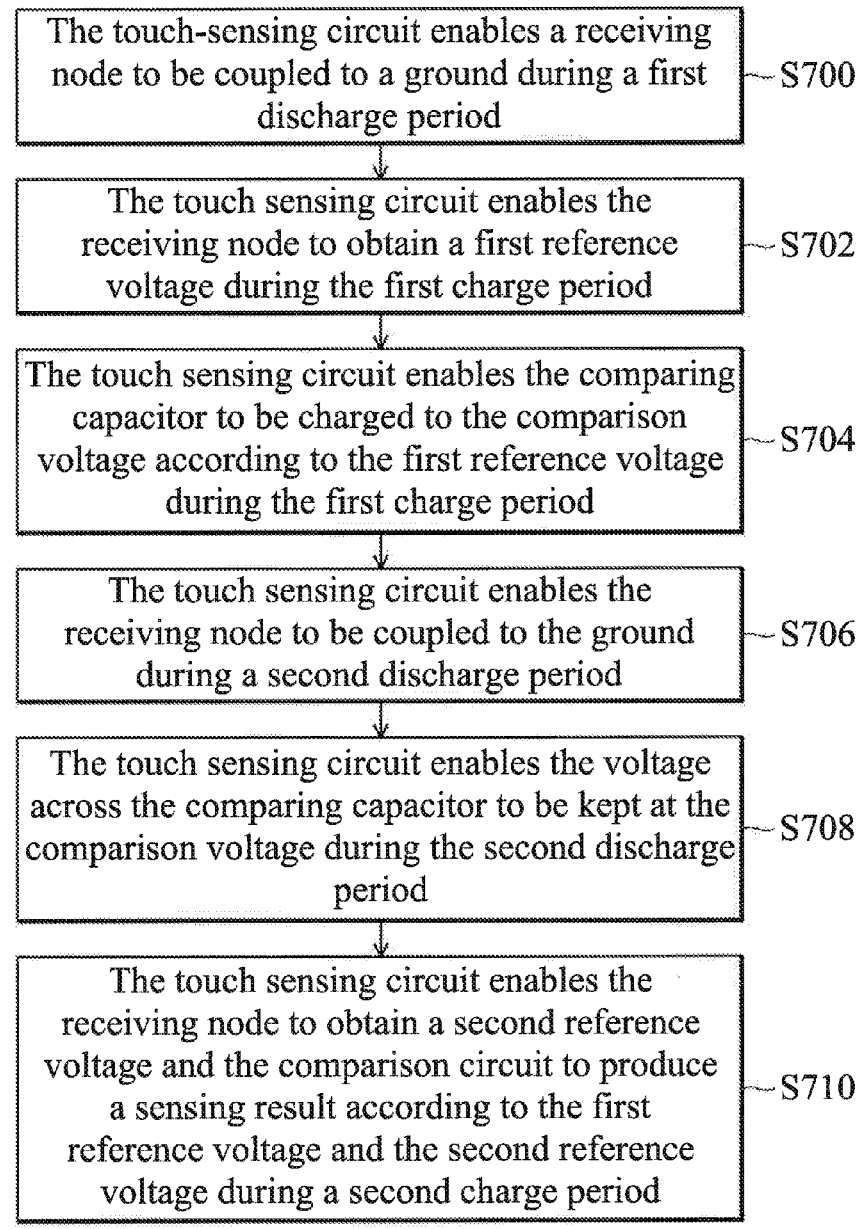
FIG. 7 is a flowchart of a touch-sensing method according to an embodiment of the present invention.

FIG. 7 is a flowchart of a touch-sensing method according to an embodiment of the present invention. The touch-sensing method can be applied to the touch-sensing circuit 200 of FIG. 1. The process starts at step S700.

In step S700, the touch-sensing circuit 200 is arranged to enable a receiving node RN to be coupled to a ground GND during a first discharge period, wherein the touch-sensing circuit 200 enables the detection circuit 210 to constitute a first discharge equivalent circuit 2101 by a plurality of switches to couple the receiving node RN to the ground GND. For example, the first switch SW1 is turned on during the first discharge period, such that the first node N1 is coupled to the ground GND. The second switch SW2 is turned on during the first discharge period, such that the second node N2 is coupled to the ground GND. The third switch SW3 is arranged to couple the receiving node RN with the first node N1 during the first discharge period. As shown in FIG. 3, the detection circuit 210 is a first discharge equivalent circuit 2101 during the first discharge period, wherein the receiving node RN is further arranged to be coupled to the ground GND through the first node N1 during the first discharge period. In another embodiment of the present invention, the third switch SW3 can also couple the receiving node RN to the second node N2, and the receiving node RN is further arranged to be coupled to the ground GND through the second node N2 during the first discharge period, but it is not limited thereto. Moreover, during the first discharge period, the voltage source Vs is 0 volts, and the fourth switch SW4 of the comparison circuit 220 is arranged to couple the input terminal of the inverter INV1 to the output terminal of the inverter INV1. It should be noted that, when the input terminal and the output terminal of the inverter INV1 are coupled with each other, the threshold voltage VT serves as the voltage Vin. Moreover, the first capacitor C1, the second capacitor C2, the third capacitor C3, the fourth capacitor C4 and the comparing capacitor Ccom are discharged for resetting the touch-sensing circuit 200 during the first discharge period.

Next, in step S702, the touch-sensing circuit 200 is arranged to enable the receiving node RN to obtain a first reference voltage VRN1 during the first charge period, wherein the touch-sensing circuit 200 enables the detection circuit 210 to constitute a first charge equivalent circuit 2102 by a plurality of switches, and provides a predetermined voltage V1 to the touch-sensing circuit 200 for producing the first reference voltage VRN1. For example, the first switch SW1 is turned off during the first charge period. The second switch SW2 is turned on during the first charge period, such that the second node N2 is coupled to the ground GND. The third switch SW3 is arranged to couple the receiving node RN to the first node N1 during the first charge period. As shown in FIG. 4, the detection circuit 210 is the first charge equivalent circuit 2102 during the first charge period. Moreover, during the first charge period, the voltage source Vs is a predetermined voltage V1, and the fourth switch SW4 of the comparison circuit 220 is arranged to couple the input terminal of the inverter INV1 to the output terminal of the inverter INV1. The receiving node RN obtains a first reference voltage VRN1 in the first charge equivalent circuit 2102. Based on the rationale of operating a capacitive voltage-dividing circuit, we can obtain equation (1).

Next, in step S704, the touch-sensing circuit 200 is arranged to enable the comparing capacitor Ccom of the comparison circuit 220 to be charged to the comparison voltage Vcin according to the first reference voltage VRN1 during the first charge period. It should be noted that the threshold voltage VT serves as the voltage Vin when the input terminal and the output terminal of the inverter INV1 are coupled.

Based on the situation that the threshold voltage VT serves as the voltage Vin when the input terminal and the output terminal of the inverter INV1 are coupled, we can obtain equation (2).

Next, in step S706, the touch-sensing circuit 200 is arranged to enable the receiving node RN to be coupled to the ground GND during a second discharge period, wherein the touch-sensing circuit 200 enables the detection circuit 210 to constitute a second discharge equivalent circuit 2103 by a plurality of switches to couple the receiving node RN with the ground GND. For example, the first switch SW1 is turned on for coupling the first node N1 to the ground GND during the second discharge period. The second switch SW2 is turned on for coupling the second node N2 to the ground GND during the second discharge period. The third switch SW3 is arranged to couple the receiving node RN to the second node N2 during the second discharge period. As shown in FIG. 5, the detection circuit 210 is a second discharge equivalent circuit 2103 during the second discharge period, wherein the receiving node RN is further arranged to be coupled to the ground GND through the second node N2 during the second discharge period. In another embodiment of the present invention, the third switch SW3 is arranged to couple the receiving node RN to the first node N1, and the receiving node RN is arranged to be coupled to the ground GND through the first node N1 during the second discharge period, but it is not limited thereto. Moreover, during the second discharge period, the voltage source Vs is 0 volts. Moreover, the first capacitor C1, the second capacitor C2, the third capacitor C3, and the fourth capacitor C4 are discharged for resetting the detection circuit 210 during the second discharge period.

Next, in step S708, the touch-sensing circuit 200 is arranged to enable the voltage across the comparing capacitor Ccom to be kept at the comparison voltage Vcin during the second discharge period. For example, the fourth switch SW4 of the comparison circuit 220 decouples the input terminal of the inverter INV1 from the output terminal of the inverter INV1 during the second charge period, such that the voltage across the comparing capacitor Ccom is kept at the comparison voltage Vcin.

Next, in step S710, the touch-sensing circuit 200 is arranged to enable the receiving node RN to obtain a second reference voltage VRN2 and the comparison circuit 220 to produce a sensing result according to the first reference voltage VRN1 and the second reference voltage VRN2 during a second charge period, wherein the comparison circuit 220 produces the sensing result according to the second reference voltage VRN2 and the comparison voltage Vcin, and the sensing result represents whether a touch event occurs on the first node N1 of the touch-sensing circuit 200. The process ends at step S710. It should be noted that the touch-sensing circuit 200 enables the detection circuit 210 to constitute a second charge equivalent circuit 2104 by a plurality of switches, and provides a predetermined voltage V1 to the touch-sensing circuit 200 to produce the second reference voltage VRN2. For example, the first switch SW1 is turned on during the second charge period, such that the first node N1 is coupled to the ground GND. The second switch SW2 is turned off during the second charge period. The third switch SW3 is arranged to couple the receiving node RN to the second node N2 during the second charge period. As shown in FIG. 6, the detection circuit 210 is the second charge equivalent circuit 2104 during the second charge period. Moreover, during the second charge period, the voltage source Vs is a predetermined voltage V1 and the fourth switch SW4 of the comparison circuit 220 is arranged to decouple the input terminal of the inverter INV1 from the output terminal of the inverter INV1, such that the inverter INV1 produces the sensing result according to the second reference voltage VRN2 and the comparison voltage Vcin. The receiving node RN obtains a second reference voltage VRN2 in the second charge-equivalent circuit 2104. Based on the rationale of operating a capacitive voltage-dividing circuit, we can obtain equation (3). Next, we can obtain equation (5) by the equation (2) and CT. It should be noted that, in one of the embodiments of the present invention, the capacitance of the comparing capacitor Ccom is much smaller than the difference between the capacitance of the first capacitor C1 and the capacitance of the third capacitor C3 (Ccom<<(C1−C3)). Therefore, equation (5) can be simplified into equation (6). Based on equation (6), when the touch event does not occur on the first node N1, we can obtain equation (7).

$$Vin = \frac{V1 \times C4 \times (C1-C3)}{CT} + VT \qquad \text{equation (7)}$$

Based on equation (6), when the touch event occurs on the first node N1, we can obtain equation (8).

$$Vin = \frac{V1 \times C4 \times (C1-C3+Csense)}{CT} + VT \qquad \text{equation (8)}$$

In one of the embodiments of the present invention, the capacitance of the first capacitor C1 is smaller than the third capacitor C3 (C1<C3), and the capacitance of the sensing capacitor Csense is larger than the difference between the capacitance of the third capacitor C3 and the first capacitor C1 (Csense>(C3−C1)). Based on the equation (7) we know that the voltage Vin is smaller than the threshold voltage VT (Vin<VT) when the touch event does not occur on the first node N1. Based on the equation (8) we know that the voltage Vin is larger than the threshold voltage VT (Vin>VT) when the touch event occurs on the first node N1. Therefore, when the touch event does not occur on the first node N1, the voltage Vin is smaller than the threshold voltage VT, and the sensing result of the inverter INV1 is 1. When the touch event occurs on the first node N1, the voltage Vin is larger than the threshold voltage VT, and the sensing result outputted by the inverter INV1 is 0. The touch-sensing circuit 200 determines whether a touch event occurs according to the sensing result outputted by the inverter INV1. during the second charge period. It should be noted that the first discharge period, the first charge period, the second discharge period, and the second charge period constitute a determinating period. The touch-sensing circuit 200 can repeat the determining period to detect whether a touch event occurs on the first node N1. For example, the determining period can be executed 10-20 times or 50-100 times in one second, but it is not limited thereto.

The touch-sensing circuit 200 and the touch-sensing method of the present invention use the detection circuit 210 which is constructed by a plurality of switches. Therefore, the inventive touch-sensing circuit 200 and the inventive touch-sensing method can inhibit the power interference of the traditional touch panel. Furthermore, the touch-sensing circuit 200 and the touch-sensing method of the present invention do not need to read the number of times the capacitor discharges with high frequency, such that the system power requirement is decreased.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch-sensing circuit, comprising:
   a detection circuit, comprising:
   a first node, arranged to generate a sensing capacitor according to a touch event;
   a first capacitor, having a first terminal coupled to the first node, and a second terminal coupled to a ground;
   a second capacitor, having a first terminal coupled to the first node, and a second terminal coupled to a second node;
   a third capacitor, having a first terminal coupled to the second node, and a second terminal coupled to the ground;
   a first switch, arranged to be coupled between the first node and the ground;
   a second switch, arranged to be coupled between the second node and the ground; and
   a third switch, arranged to couple the first node or the second node to a receiving node;
   a fourth capacitor, having a first terminal coupled to a voltage source, and a second terminal coupled to the receiving node; and
   a comparison circuit, arranged to produce a sensing result according to a voltage at the receiving node.

2. The touch-sensing circuit as claimed in claim 1, wherein the capacitance of the first capacitor is smaller than the capacitance of the third capacitor, and the difference between the capacitance of the third capacitor and the capacitance of the first capacitor is less than the capacitance of the sensing capacitor.

3. The touch-sensing circuit as claimed in claim 1, wherein the receiving node is arranged to obtain a first reference voltage during a first charge period and obtain a second reference voltage during a second charge period, respectively, and the comparison circuit is further arranged to produce the sensing result according to the first reference voltage and the second reference voltage.

4. The touch-sensing circuit as claimed in claim 3, wherein the receiving node is further arranged to be coupled to the ground during a first discharge period and a second discharge period, wherein the first charge period is scheduled after the first discharge period, the second discharge period is scheduled after the first charge period, and the second charge period is scheduled after the second discharge period.

5. The touch-sensing circuit as claimed in claim 4, wherein the detection circuit is a first discharge equivalent circuit and the voltage source is 0 volts during the first discharge period, and wherein the first switch is tuned on, the second switch is turned on, and the third switch is arranged to couple the receiving node with the first node to constitute the first discharge equivalent circuit.

6. The touch-sensing circuit as claimed in claim 4, wherein the detection circuit is a first charge equivalent circuit and the voltage source is a predetermined voltage during the first charge period, and wherein the first switch is turned off, the second switch is turned on, and the third switch is arranged to couple the receiving node with the first node to constitute the first charge equivalent circuit.

7. The touch-sensing circuit as claimed in claim 4, wherein the detection circuit is a second discharge equivalent circuit and the voltage source is 0 volts during the second discharge period, and wherein the first switch is turned on, the second switch is turned on, and the third switch is arranged to couple the receiving node with the second node to constitute the second discharge equivalent circuit.

8. The touch-sensing circuit as claimed in claim 4, wherein the detection circuit is a second charge equivalent circuit and the voltage source is a predetermined voltage during the second charge period, and wherein the first switch is turned on, the second switch is turned off, and the third switch is arranged to couple the receiving node with the first node to constitute the second charge equivalent circuit.

9. The touch-sensing circuit as claimed in claim 4, wherein the comparison circuit further comprises:
   a comparing capacitor, having a first terminal coupled to the receiving node, and a second terminal;
   an inverter, having an input terminal coupled to the second terminal of the comparing capacitor, and an output terminal arranged to output the sensing result; and
   a fourth switch, arranged to be coupled between the first terminal and the second terminal of the inverter.

10. The touch-sensing circuit as claimed in claim 9, wherein the capacitance of the comparing capacitor is smaller than the difference between the capacitance of first capacitor and the capacitance of the third capacitor.

11. The touch-sensing circuit as claimed in claim 9, wherein:
   the fourth switch is arranged to connect the input terminal of the inverter with the output terminal of the inverter for enabling the comparing capacitor to be charged to a comparison voltage according to the first reference voltage during the first charge period;
   the fourth switch is arranged to decouple the first terminal of the inverter from the output terminal of the inverter for enabling a voltage across the comparing capacitor to be kept at the comparison voltage during second discharge period; and
   the fourth switch is arranged to decouple the first terminal of the inverter from the output terminal of the inverter for enabling the inverter to produce the sensing result according to the second reference voltage and the comparison voltage during the second charge period.

12. A touch-sensing method, applied to a touch-sensing circuit, wherein the touch-sensing circuit comprises a detection circuit and a comparison circuit, the touch-sensing method comprising:
   enabling a receiving node to be coupled to a ground during a first discharge period, wherein the receiving node is coupled between the detection circuit and the comparison circuit;
   enabling the receiving node to obtain a first reference voltage during a first charge period;
   enabling the receiving node to be coupled to the ground during a second discharge period; and
   enabling the receiving node to obtain a second reference voltage and producing a sensing result according to the first reference voltage and the second reference voltage by the comparison circuit during a second charge period, wherein the sensing result represents whether a touch event occurs at the first node of the touch-sensing circuit.

13. The touch-sensing method as claimed in claim 12, wherein the first charge period is scheduled after the first discharge period, the second discharge period is scheduled after the first charge period, and the second charge period is scheduled after the second discharge period.

14. The touch-sensing method as claimed in claim 13, wherein the step of enabling the receiving node to be coupled to the ground during the first discharge period further comprises the step of enabling the detection circuit to constitute a first discharge equivalent circuit to couple the receiving node to the ground by a plurality of switches.

15. The touch-sensing method as claimed in claim 13, wherein the step of enabling the receiving node to obtain the first reference voltage during the first charge period further comprises the steps of enabling the detection circuit to constitute a first charge equivalent circuit by a plurality of switches, and providing a predetermined voltage to the touch-sensing circuit to produce the first reference voltage.

16. The touch-sensing method as claimed in claim 13, wherein the step of enabling the receiving node to be coupled to the ground during the second discharge period further comprises the step of enabling the detection circuit to constitute a second discharge equivalent circuit to couple the receiving node to the ground by a plurality of switches.

17. The touch-sensing method as claimed in claim 13, wherein the step of enabling the receiving node to obtain a first reference voltage during a second charge period further comprises the steps of enabling the detection circuit to constitute a second charge equivalent circuit by a plurality of switches, and providing a predetermined voltage to the touch-sensing circuit to produce the second reference voltage.

18. The touch-sensing method as claimed in claim 13, further comprising the step of:
   enabling a comparing capacitor of the comparison circuit to be charged to a comparison voltage according to the first reference voltage during the first charge period; and
   enabling a voltage across the comparing capacitor to be kept at the comparison voltage during the second discharge period, wherein the step of producing the sensing result according to the first reference voltage and the second reference voltage is achieved by producing the sensing result according to the second reference voltage and the comparison voltage.

* * * * *